United States Patent
Wang et al.

(10) Patent No.: US 7,569,308 B2
(45) Date of Patent: Aug. 4, 2009

(54) RECTANGULAR CONTACT LITHOGRAPHY FOR CIRCUIT PERFORMANCE IMPROVEMENT AND MANUFACTURE COST REDUCTION

(75) Inventors: Jun Wang, Hong Kong (CN); Alfred K. Wong, Hong Kong (CN); Edmund Y. Lam, Hong Kong (CN)

(73) Assignee: The University of Hong Kong, Hong Kong (CN)

( * ) Notice: Subject to any disclaimer, the term of this patent is extended or adjusted under 35 U.S.C. 154(b) by 438 days.

(21) Appl. No.: 11/065,413

(22) Filed: Feb. 24, 2005

(65) Prior Publication Data
US 2005/0196685 A1  Sep. 8, 2005

Related U.S. Application Data

(60) Provisional application No. 60/546,948, filed on Feb. 24, 2004.

(51) Int. Cl.
*G03F 9/00* (2006.01)
*G03F 7/20* (2006.01)

(52) U.S. Cl. .......................... 430/5; 430/311; 430/394; 430/322

(58) Field of Classification Search ...................... 430/5, 430/394, 311, 396
See application file for complete search history.

(56) References Cited

OTHER PUBLICATIONS

Tyrrell et al., Journal of Microlithography, Microfabrication and Microsystems, vol. 1, No. 3, pp. 243-252 (2002).
Fritze et al., Proceedings of SPIE, vol. 5042, pp. 15-29 (2003).
Wang et al., Proceedings of SPIE, vol. 5043, pp. 134-141 (2003).

*Primary Examiner*—Mark F Huff
*Assistant Examiner*—Caleen O Sullivan
(74) *Attorney, Agent, or Firm*—Berkeley Law & Technology Group LLP (57) ABSTRACT

An optical lithography method is disclosed that uses double exposure of a reusable template mask and a trim mask to fabricate regularly-placed rectangular contacts in standard cells of application-specific integrated circuits (ASICs). A first exposure of the reusable template mask with periodic patterns forms periodic dark lines on a wafer and a second exposure of an application-specific trim mask remove the unwanted part of the dark lines and the small cuts of the dark lines left form the rectangular regularly-placed contacts. All contacts are placed regularly in one direction while unrestrictedly in the perpendicular direction. The regular placement of patterns on the template mask enable more effective use of resolution enhancement technologies, which in turn allows a decrease in manufacturing cost and the minimum contact size and pitch. Since there is no extra application-specific mask needed comparing with the conventional lithography method for unrestrictedly-placed contacts, the extra cost is kept to the lowest. The method of the invention can be used in the fabrication of standard cells in application-specific integrated circuits (ASICs) to improve circuit performance and decrease circuit area and manufacturing cost.

15 Claims, 6 Drawing Sheets

Typical layout of a standard cell

Fig.1 Typical layout of a standard cell

Fig. 2a. Contact pitches (horizontal direction)
Average pitch distributions of contacts in standard cells Fig. 2b. Contact pitches (vertical direction)
Average pitch distributions of contacts in standard cells Fig.3 The demo layout of contacts.

Fig. 4a. Chromeless alternating phase-shifting template mask for the second exposure Fig. 4b. Exposure image of the template mask Fig. 5a. Binary trim mask of the demo contacts for the second exposure Fig. 5b. Exposure image of the binary trim mask for the demo contacts.

Fig.6 The overlap of the Fig.4b and the Fig.5b forms the final image of the demo contacts

RECTANGULAR CONTACT LITHOGRAPHY FOR CIRCUIT PERFORMANCE IMPROVEMENT AND MANUFACTURE COST REDUCTION

CROSS-REFERENCE TO RELATED APPLICATIONS

This application is a non-provisional based on U.S. Provisional Application Ser. No. 60/546,948, filed Feb. 24, 2004, which is incorporated herein in its entirety by reference.

FIELD OF THE INVENTION

The present invention relates to optical lithography. More specifically, the invention relates to a double-exposure photolithography method using a reusable template mask and a trim mask to image regularly-placed rectangular contacts. The method of the invention can be used in the fabrication of a contact layer of standard cells in application-specific integrated circuits (ASICs) to improve circuit performance and decrease circuit area and manufacturing cost.

BACKGROUND OF THE INVENTION

The continuous demand for high speed integrated circuits (ICs) results in the continuous increase of transistor density and decrease of the feature size in the past two decades. As a technology to print circuit patterns with submicron features, and to place those features on a silicon substrate with ever higher recision, optical lithography is the cornerstone of modern IC manufacturing. Its development has been the primary factor driving improvements of IC technology for several decades. According to the 15-year roadmap for lithography requirement in the 2001 ITRS, optical lithography is projected to remain the dominant technology option at least in the next decade until the appearance of the next-generation microlithography technology. The critical dimension (CD)—the minimum feature size that can be defined by optical lithography—has been reduced to 130 nm in 2001 and is projected to have a 30% reduction in every three years.

Following Moore's Law, chip feature sizes are shrinking at a faster clip than resolution improvements enabled by developments in optical lithography equipment. In addition to enhancements in materials and equipment, resolution enhancement techniques (RETs) and new design methodologies are required to facilitate the projected reduction in feature size. It was the application of RETs in the past decade, coupling with the improvement in system equipment, that helped improve resolution of optical lithography systems to the current 100-nm level. However, the improvement of optical lithography equipment come to a halt due to the extreme technology challenges in developing the next generation optical imaging system with a smaller illumination wavelength. Applying highly-optimized strong-RETs is the only viable solution for all future optical technology nodes below 100 nm. Invented in 1982, strong-RETs based on two-beam imaging provided a solution for today's challenge two decades ago. However, although the achieved resolution can be doubled, challenges associated with the two-beam imaging, not only for electronic design automation (EDA) solutions, but also for manufacturing cost, prevented it from being implemented in the past.

If strong-RETs are carefully optimized, they will provide adequate resolution for sub-100 nm nodes and afford sufficient process latitude. Physical design constraints required by strong-RETs imposed on circuit design and cannot be enforced through conventional design flows. The RET-embedded design flow, which is required by the strong-RET-imposed layout restrictions to guarantee layout-compliant designs, is significantly more complicated than conventional flow and requires a design and process integration (DPI). RET-compliant design tools are put into the hands of the designers in the new flow. That increases difficulties in EDA software design and requires layout designers to have a good knowledge of the strong-RETs used in a process. Furthermore, the process-specific nature of RET-specific optimization in the new flow does not ensure design compatibility with future lithography solutions. All of these increase design cost for sub-100 nm technology nodes as well as manufacturing cost which has been pushing to an alarming level because of increasingly complicated fabrication process with highly-optimized RETs. An easily established and non-RET-specific process will be more attractive for circuit designers.

To overcome the above-mentioned challenges, manufacturability should be taken in consideration during the design stage. The term "Design for Manufacturability" (DFM) has been introduced in the industry. The manufacturability includes low manufacturing cost, compatibility among different RET approaches (non-RET-specific), simplicity for process optimization, and ease for migration of designs into future technology nodes.

To achieve these objectives, fabrication-friendly layout, in which circuit pattern configurations are limited to allow lithography optimization, is introduced. Designs with the introduced radical layout restrictions can be compliant for all strong-RETs, and therefore, free layout designers from RET-compliant layout tools. A major benefit of fabrication-friendly layout is the dramatic simplification of the layout methodology. The introduced radical layout restrictions can be easily embedded into the conventional design rules and keep the conventional design flow and EDA solutions still workable for the sub-100 nm technology nodes. The non-RET-specific design also simplifies the process optimization and ensures layout compatibility with future lithography solutions.

However, there is no "free lunch" in the world. As a trade-off between design flexibility and manufacturability, fabrication-friendly layout decreases the flexibility in physical design. Although the features can be designed smaller and packed closer, the excessive lithography friendliness in fabrication-friendly layout may be so restrictive on layout design that circuit area increases unacceptably. It should be studied extensively to seek a fine balance between design flexibility and manufacturability.

Therefore, the application of fabrication-friendly layout depends on the type of applications. For low-volume product market, such as application-specific integrated circuits (ASICs), keeping the manufacturing cost in an acceptable region for the sub-100 nm technology nodes is more critical than keeping a high improvement ratio of product performance. On the other hand, for performance-dominant products, such as microprocessor units (MPUs), or high-volume products, such as Dynamic Random Access Memory (DRAM), design and manufacturing cost is not the first factor in consideration. Therefore, simplifying the design flow and lithography optimization procedure, fabrication-friendly layout offers a possibility to decrease design and manufacturing cost for sub-100 nm technology nodes and becomes a very attractive option for ASIC foundries.

Contact level is one of the most difficult parts of a lithography process and has the biggest cost weighting. In the application of fabrication-friendly contacts in standard cells, one of the core blocks of cell-based application-specific integrated circuits (ASICs), the contact should the placed unrestrictedly in the height direction while regularly in the width direction with 1½ transistor pitch as the grid pitch. Transistor pitch, also called a "contacted pitch," is the minimum pitch between two gates with a contact between them. Because MOSFETs in a standard cell are placed one by one in the width direction, the width of a cell is roughly determined by the product of the transistor pitch and the number of the transistors. Reduction of the contact size gets a reduced transistor pitch and leads to a decrease of the cell width. On the other hand, it is the metal-1 pitch instead of the contact pitch or size that determines the height of a standard cell. The minimum pitch and size of contacts in the height direction is not critical for the height of standard cells. Applying a regular placement on the contacts in the height direction cannot help to decrease the height of a standard cell except for an increased difficulty in the layout compaction.

However, there are several difficulties to apply such a regularly-placed layout on a standard cell. First, although many advanced lithography approaches for fabrication-friendly contacts have been proposed in the last few years [BT02], pushing the revolution to about its minimum value, all of these approaches place contacts regularly in both directions at the same time [BT02, WJ03]. Second, although the resolution (single-exposure) can be improved by a regularly-placed layout, the desired grid pitch (1½ transistor pitch) is still smaller than the improved resolutions of a contact layer. Although multiple exposures can be introduced to fabricate the new layout [SN96,WJ03], it increases the cost and decreases the throughput. The lithographic approach should be selected carefully to decrease the number of extra masks and exposures.

SUMMARY OF THE INVENTION

Accordingly, it is an object of the present invention to provide a lithography method by which circuit area and performance of standard cells in application-specific integrated circuits (ASICs) is improved while manufacturing cost is reduced.

It is another object of the present invention to provide a lithography method using double-exposure of a reusable template mask and a trim mask for contact fabrication.

It is yet another object of the present invention to provide a lithography method by introducing less extra restrictions in layout design when apply fabrication-friendly contacts on design of standard cells in application-specific integrated circuits (ASICs).

It is yet another object of the present invention to provide a lithography method for regularly-placed contact fabrication with no extra application-specific mask needed comparing with conventional contact lithography methods.

One embodiment of the present invention is directed to a method of optical lithography wherein rectangular contacts placed unrestrictedly in one direction while regularly in the perpendicular direction characterized by a grid pitch, the grid pitch being selected to minimize the circuit area increase caused by the use of the grid, are printed to the wafer by double exposures by a reusable chromeless alternating phase-shifting template mask and a trim mask. The rectangular contacts have a smaller dimension in the direction in which contacts are placed regularly.

A reusable chromeless alternating phase-shifting template mask is exposed first. The opposite phase shift of periodic 0° and 180° regions on the chromeless phase-shifting template mask creates periodic unexposed dark lines at the boundary of 0° and 180° regions. The period of the 0° and 180° regions on the chromeless alternating phase-shifting template mask is design to be one transistor pitch so that the period of the dark lines is half of that. The exposure of a contact trim mask on these periodic dark lines removes the unwanted parts of the dark lines and the small cuts of the dark lines left form the regularly-placed contacts.

Contacts are placed regularly in the width direction and unrestrictedly in the height direction in this invention. The size and location of contacts in the width direction are determined by the exposure of the reusable template mask, while the size and location of contacts in the height direction are determined by the trim mask. Because the features in the trim mask are placed unrestrictedly, the location of contacts in the height direction are also unrestricted. The size of contacts is different in different directions because size is determined by the exposures of the different masks. Imaged by a template mask with periodic patterns in the width direction, the size of contacts in the width direction is much smaller than the size of contacts in the height direction which is determined by the resolution of the exposure of the trim mask with unrestrictedly-placed features.

There are 2 masks (1 reusable template mask and 1 application-specific trim mask) and 2 exposures are needed to fabricate the rectangular regularly-placed contacts in standard cells. Since there is no extra application-specific mask needed comparing with the conventional lithography method for unrestrictedly-placed contacts, the extra cost is kept to the lowest.

A regular placement of contacts enables more effective use of resolution enhancement technologies, which in turn allows a reduction of manufacturing cost and the minimum contact size and pitch. However, the extra restrictions in layout increase the complexity of a layout design and might offset the benefits from the reduced contact size and pitch. Whether a circuit area will be smaller or not after using a regular contact placement depends on applications. It should be studied extensively to seek a fine balance between design flexibility and manufacturability.

In the application of regularly-placed contacts in standard cells, one of the core blocks of cell-based application-specific integrated circuits (ASICs), the contacts should be placed unrestrictedly in the height direction while regularly in the width direction with 1½ transistor pitch as the grid pitch. Transistor pitch, also called a "contacted pitch," is the minimum pitch between two gates with a contact between them. MOSFETs in a standard cell are placed one by one in the width direction. The width of a cell is roughly determined by the product of the transistor pitch and the number of the transistors. Reduction of the contact size gets a reduced transistor pitch and leads to a decrease of the cell width. On the other hand, it is the metal-1 pitch instead of the contact pitch or size that determines the height of a standard cell. The minimum pitch and size of contacts in the height direction is not critical for the height of standard cells. Applying a regular placement on the contacts in the height direction cannot help to decrease the height of a standard cell except for an increased difficulty in the layout compaction.

In this invention, rectangular contacts placed unrestrictedly in the height direction while regularly in the width direction characterized by a grid pitch, the grid pitch being selected to minimize the circuit area increase caused by the use of the grid, are printed to the wafer by double exposures of a reusable template mask and a trim mask. The rectangular contacts have a smaller dimension in the width direction.

A reusable chromeless alternating phase-shifting template mask is exposed first. The opposite phase shift of periodic 0° and 180° regions on the chromeless phase-shifting template mask creates periodic unexposed dark lines at the boundary of 0° and 180° regions. The period of the 0° and 180° regions on the chromeless alternating phase-shifting template mask is design to be one transistor pitch so that the period of the dark lines is half of that. The exposure of a contact trim mask on these periodic dark lines remove the unwanted parts of the dark lines and the small cuts of the dark lines left form the rectangular-placed contacts.

With the present method, the size and location of contacts in the width direction are determined by the exposure of the template mask, while the size and location of contacts in the height direction are determined by the trim mask. Because the features in the trim mask are placed unrestrictedly, the location of contacts in the height direction are also unrestrictedly. Determined by the exposures of the different masks, the size of contacts is different in different directions. Imaged by a template mask with periodic patterns in the width direction, the size of contacts in the width direction is much smaller than the size of contacts in the height direction which is determined by the resolution of the exposure of the trim mask with unrestrictedly-placed features.

There are 2 masks (1 reusable template mask and 1 application-specific trim mask) and 2 exposures are needed to fabricate the rectangular regularly-placed contacts in standard cell. Since there is no extra application-specific mask needed comparing with the conventional lithography method for unrestrictedly-placed contacts, extra cost is minimized

BRIEF DESCRIPTION OF THE DRAWINGS

The invention will be described by reference to the drawings in which.

DETAILED DESCRIPTION OF THE PREFERRED AND ALTERNATIVE EMBODIMENTS

Figure 1:
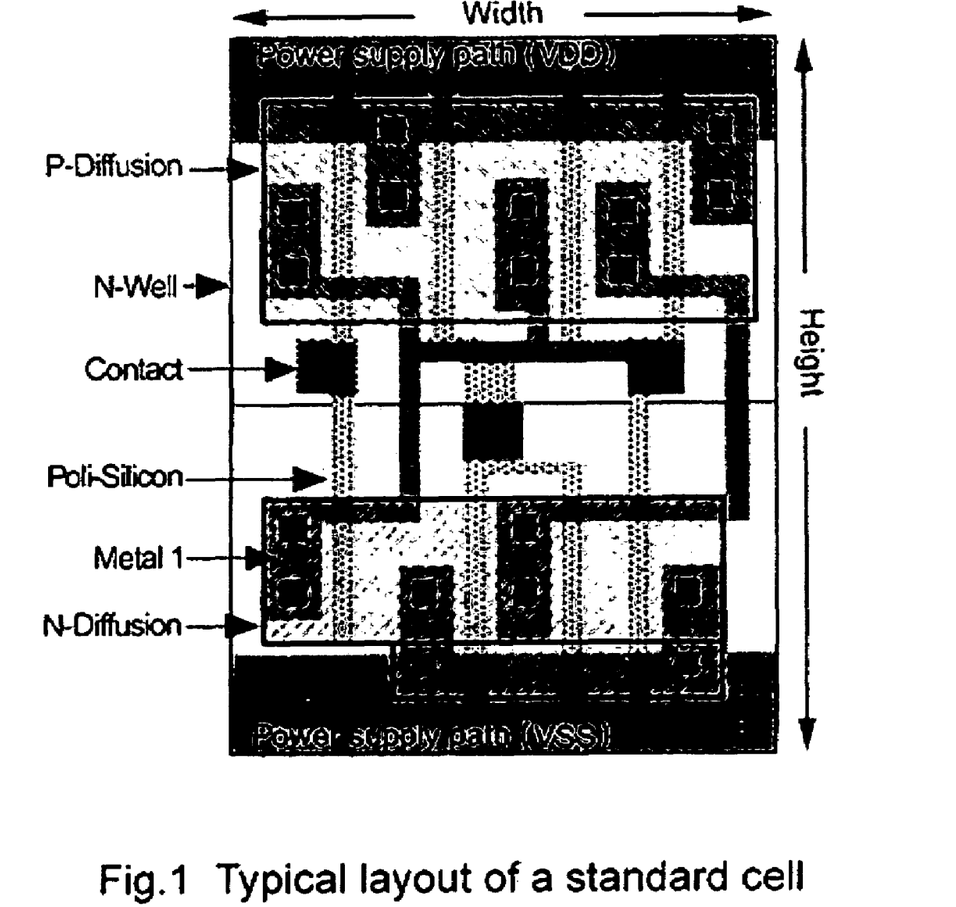
FIG. 1 is a diagram illustrating the structure of a standard cell.

FIG. 1 is a diagram illustrating the structure of a standard cell. Each standard cell in a library is rectangular with a fixed height but varying widths. The cells are placed in rows with overlapping power supply paths. A standard cell typically has an N-well layer, an N-diffusion layer, a P-diffusion layer, a poly-silicon layer, a contact layer, and a metal-1 layer. The N-well, N-diffusion 330, P-diffusion and poly-silicon form P-MOS and N-MOS inside the cells. The poly-silicon also serves as an intra-cell routing path. The contacts 360 form connections between the routing layers and the under layers.

The height of a cell is typically given as the number of metal-1 tracks over the cells in the height direction. A metal-1 track comprises the metal-1 path and the space between metal-1 paths. The typical height of a standard cell is 10 tracks, where three tracks are used for power supply paths and the remaining seven tracks are for intra-cell design.

Placing features regularly in a direction facilitates the optimization of a lithography process in that direction and leads to a reduced feature pitch and size. In certain applications, the extra restrictions in layout increase the complexity of a layout design and might offset the benefits from the reduced critical dimension (CD). That means whether to apply the regular layout placement on one kind of features in a direction depends on how the CD of these features affects the cell area in that direction. Because MOSFETs in a standard cell are placed one by one in the width direction, such as those shown in FIG. 1, the width of a cell is roughly determined by the product of the transistor pitch and the number of the transistors. Reduction of the contact size yields a reduced transistor pitch and leads to a decrease of the cell width. On the other hand, it is the metal-1 pitch determines the height of a standard cell. The minimum pitch and size of contacts in the height direction is not critical for the height of standard cells. Applying a regular placement on the contacts in the height direction cannot help to decrease the height of a standard cell except for an increased difficulty in the layout compaction. Regularly-placed layout is applied on metal-1 layer to decrease the height. In one embodiment, multiple exposures are needed to fabricate the regularly-placed layout. The more layers on which regular placed layout is applied, the more extra masks and exposures are need. That may not be practical from an economics point of view [MF03].

Figure 2A:
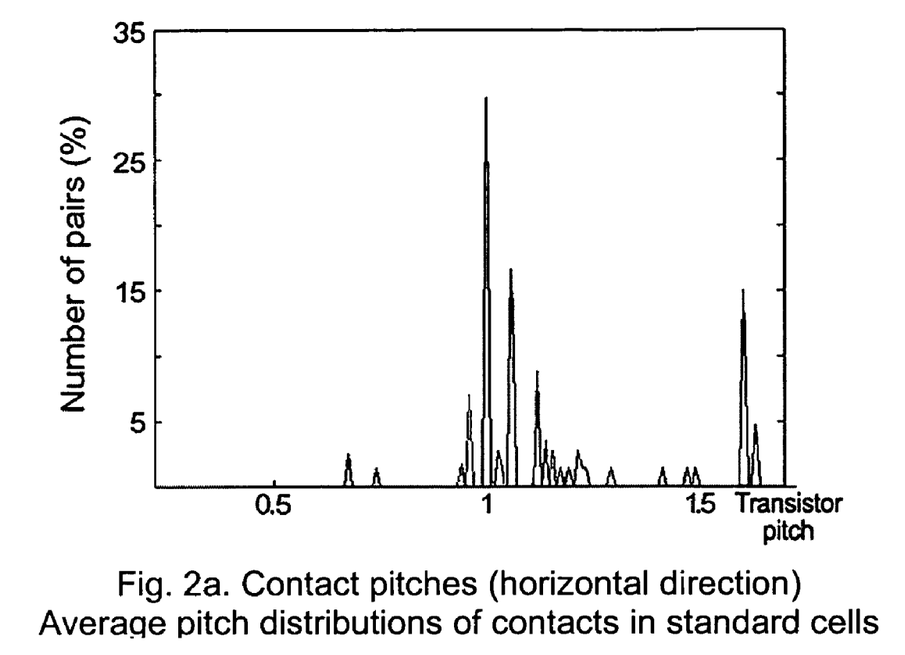
FIG. 2a is a diagram showing the contact pitch distribution in the width direction for standard cells.

FIG. 2a is a diagram showing the average contact pitch distribution of standard cells in the width direction. The dominant peak in the pitch distribution, which is one transistor pitch, should be used as the grid pitch, or a multiple of the grid pitch, in the width direction.

Figure 2B:
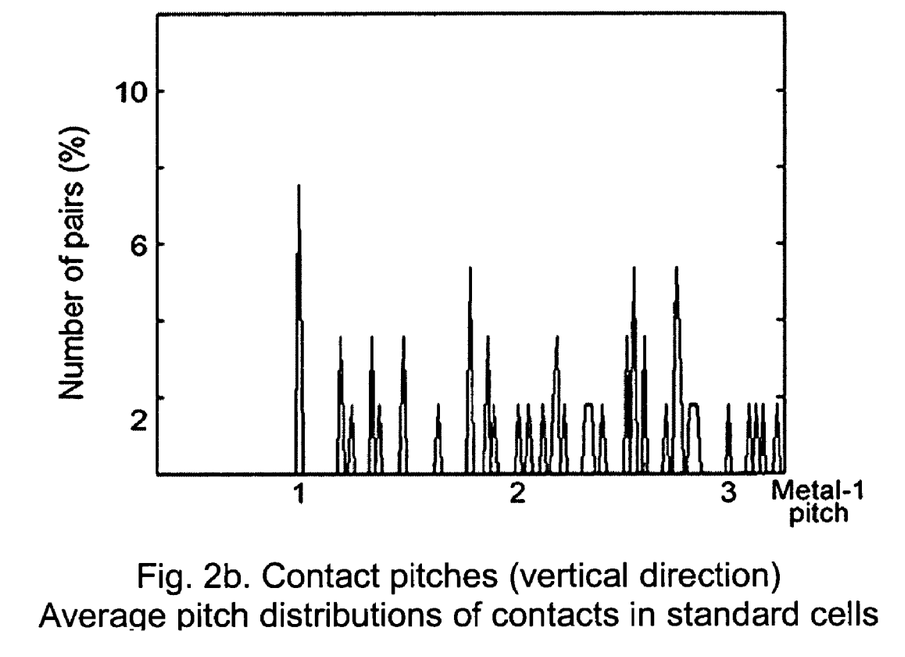
FIG. 2b is a diagram showing the contact pitch distribution in the height direction for standard cells.

FIG. 2b is a diagram showing the average contact pitch distribution of standard cells in the height direction, there is no a dominant peak in the pitch distribution. That means the original placements of contacts are quite random in the height direction. Placing them regularly in the height direction increases the restriction during layout design and offsets some width decrease resulted from the regular placement in the width direction. Therefore, it would better to keep the height placement of contacts unrestricted.

Figure 3:
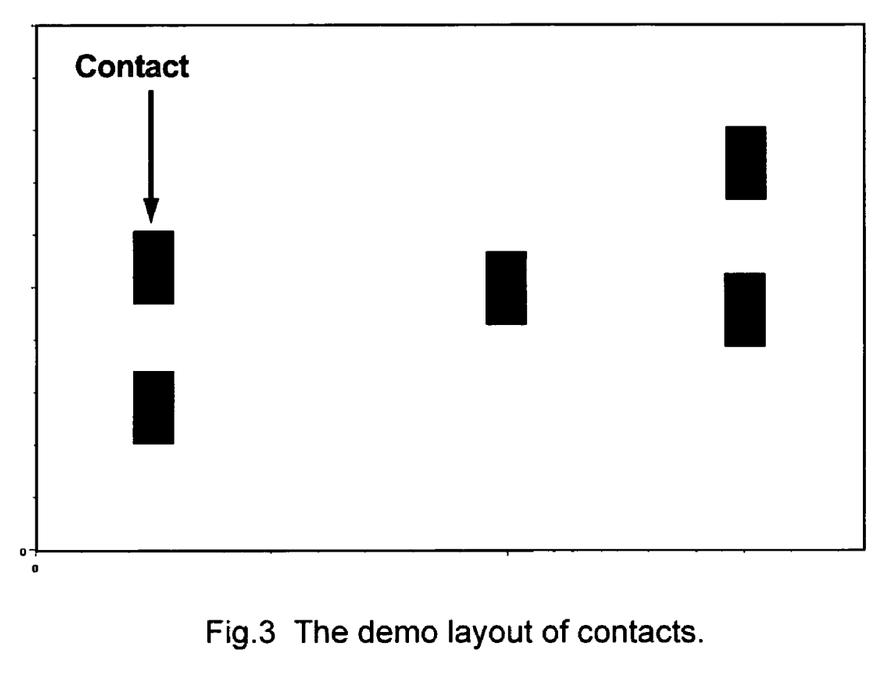
FIG. 3 is a demonstration layout of rectangular contacts.

FIG. 3 is a layout of contacts according to one embodiment of the invention for a demonstration. All contacts are placed unrestrictedly in the height direction while regularly in the width direction with 1½ transistor pitch as the grid pitch.

Figure 4A:
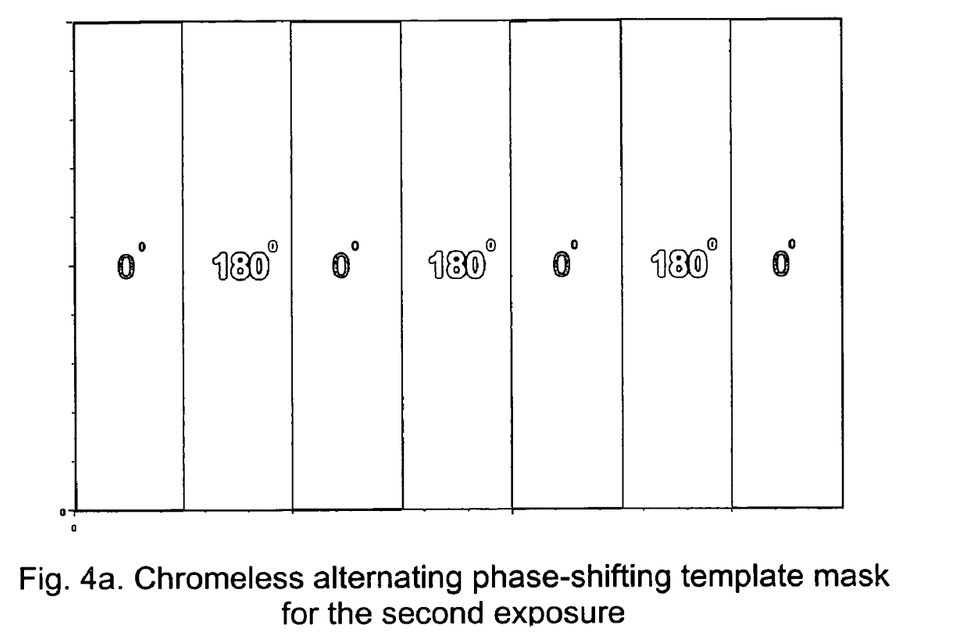
FIG. 4a is the reusable chromeless alternating phase-shifting template mask for the first exposure.
Figure 4B:
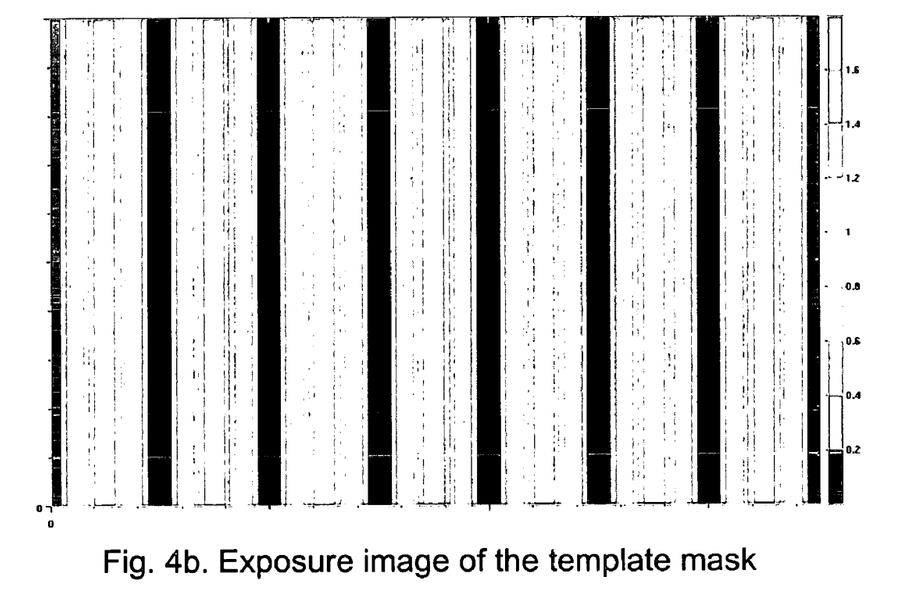
FIG. 4b is the exposure image of the template mask.

FIG. 4 illustrates the first step of the invention: an exposure of the reusable chromeless alternating phase-shifting template mask with periodic 0° and 180° regions (FIG. 4a) forms periodic dark lines on a wafer (FIG. 4b). After the exposure, the opposite phase shift of regions on the chromeless alternating phase-shifting template mask creates periodic unexposed dark lines at the boundary of 0° and 180° regions. The period of the 0° and 180° regions on the chromeless phase-shifting template mask is design to be one transistor pitch so that the period of the dark lines is half of that.

Figure 5A:
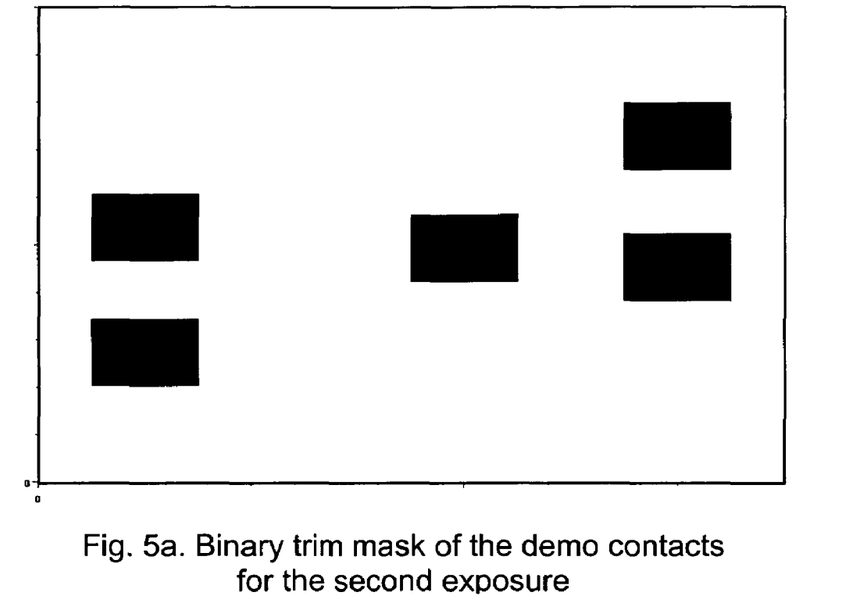
FIG. 5a is the trim mask of the demonstration contacts for the second exposure.
Figure 5B:
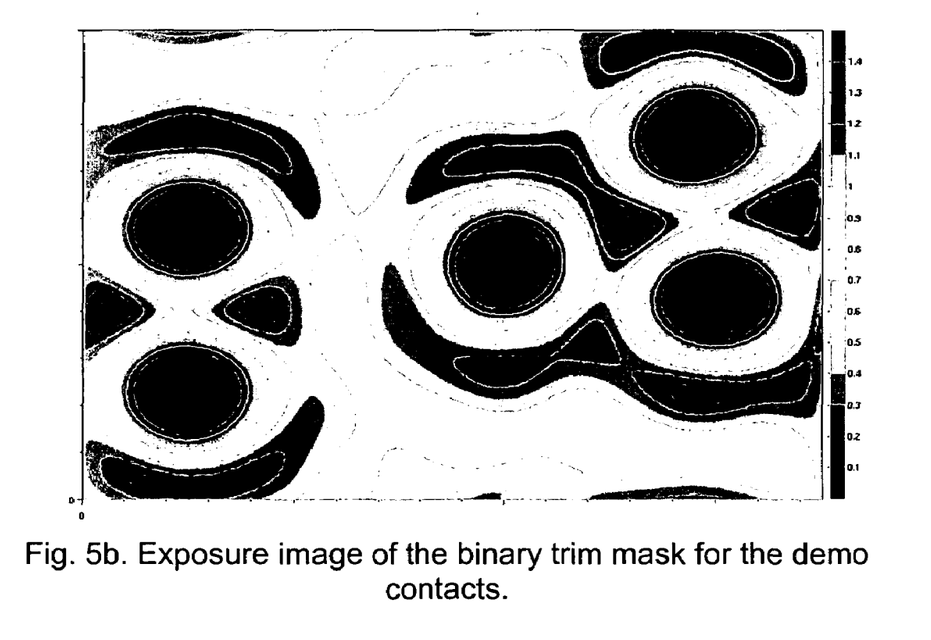
FIG. 5b is exposure image of the trim mask for the demonstration contacts.

FIG. 5 illustrates the second step of the invention: Exposures of the trim mask (FIG. 5a) on the period dark lines which is formed by the exposure of the reusable template mask. FIG. 5b is the exposure image of the trim mask.

Figure 6:
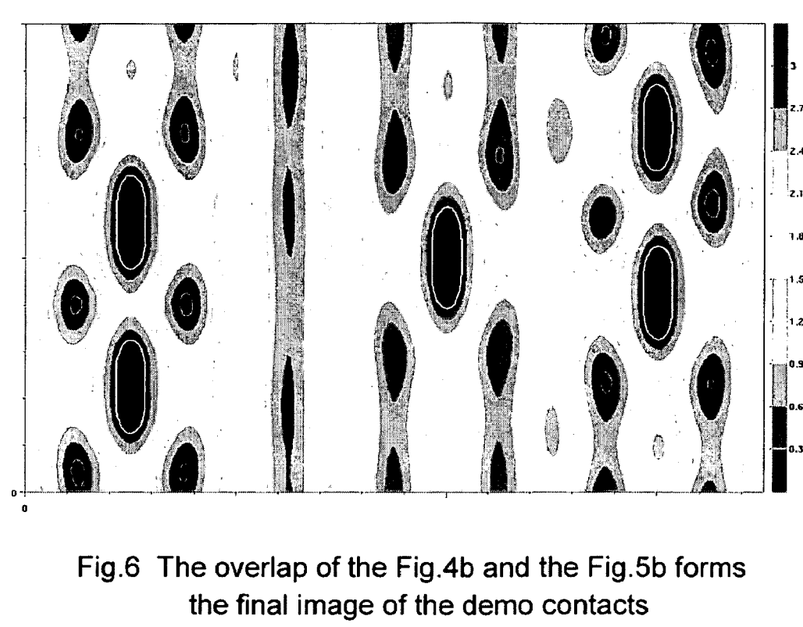
FIG. 6 is the final image of the demonstration contacts by the overlap of the FIG. 4b and the FIG. 5b.

FIG. 6 shows the final image of contacts by the overlap of the exposure of reusable template mask (FIG. 4b) and the trim mask (FIG. 5b). The exposure of a trim mask on the periodic dark lines remove the unwanted parts of the dark lines and the small cuts of the dark lines left form the regularly-placed rectangular contacts. As a short cut of a dark line, a contact in this method has different dimensions in different directions.

The width size and location of contacts are determined by the width size and location of the dark lines, while the height dimension and position are determined by the size and location of the figures in the trim mask. Therefore, the width size of figures in a trim mask is not critical and can be made larger, while the height size of the figures in a trim mask is designed as small as possible according to the resolution of the exposure. Resolution enhancement techniques (RETs) can also be applied in a trim mask to control the contact height size. Because the features in the trim are placed unrestrictedly, the location of contacts in the height direction are also unrestricted.

The size of contacts is in different directions is determined by the exposures of the different masks. Imaged by a template mask with periodic patterns in the width direction, the size of contacts in the width direction is much smaller than the size of contacts in the height direction which is determined by the resolution of the exposure of the trim mask with unrestrictedly-placed features.

There are 2 masks (1 reusable template mask and 1 application-specific trim mask) and 2 exposures are needed to fabricate the rectangular regularly-placed contacts in standard cells. Since there is no extra application-specific mask needed comparing with the conventional lithography method for unrestrictedly-placed contacts, the extra cost is kept to the lowest.

What is claimed is:

1. An optical lithography method to fabricate integrated circuits, comprising:
   placing rectangular contacts on a grid in a first direction;
   placing rectangular contacts unrestrictedly in a second direction substantially perpendicular to the first direction;
   wherein said placing rectangular contacts on said grid in said first direction comprises exposing a reusable template mask to form periodic dark lines; and
   wherein said placing rectangular contacts unrestrictedly in a second direction comprises exposing a trim mask on the periodic dark lines to form the rectangular contacts.

2. The optical lithography method according to claim 1, wherein the contact size in the first direction is smaller than the contact size in the second direction.

3. The optical lithography method according to claim 1, wherein said reusable template mask comprises a reusable chromeless alternating phase-shifting template mask with periodic 0 degree and 180 degree regions that is exposed to create periodic unexposed dark lines at the boundary of 0 degree and 180 degree regions, the period of the 0 degree and 180 degree regions on the chromeless alternating phase-shifting template mask being one transistor pitch so that the period of the dark lines is half of that and the exposure of the trim mask removes unwanted parts of the periodic dark lines and small cuts of the dark lines left from the regularly-placed rectangular contacts.

4. The optical lithography method according to claim 1, wherein size and location of contacts in the first direction are determined by the exposure of the reusable template mask, and size and location of contacts in the second direction are determined by the exposure of the trim mask.

5. The optical lithography method according to claim 1, wherein said placing rectangular contacts on said grid in said first direction comprises exposing said reusable template mask to form periodic dark lines so that a period of the dark lines is half of one transistor pitch.

6. Lithography masks comprising:
   a reusable template mask capable of positioning rectangular contacts on a grid in a first direction; and
   an application-specific trim mask capable of positioning said rectangular contacts unrestrictedly in a second direction substantially perpendicular to the first direction,
   wherein no extra application-specific mask is employed to fabricate the rectangular regularly-placed contacts in standard cells.

7. The lithography masks according to claim 6, wherein the reusable template mask comprises a reusable chromeless alternating phase-shifting template mask with periodic 0 degree and 180 degree regions for creating periodic unexposed dark lines at the boundary of 0 degree and 180 degree regions.

8. The lithography masks according to claim 6, wherein the application-specific trim mask comprises a contact trim mask for removing the unwanted parts of the dark lines so that small cuts of the dark lines left form the rectangular regularly-placed contacts.

9. The lithography masks of claim 8, wherein size and location of contacts in a first direction are determined by exposure of the template mask, and size and location of contacts in a second direction are determined by the exposure of the trim mask.

10. The optical lithography method of claim 1, wherein said exposing a trim mask on the periodic dark lines comprises exposing a trim mask on the periodic dark lines unrestrictedly in a second direction substantially perpendicular to the first direction to form the rectangular contacts.

11. A method, comprising:
    exposing a reusable template mask to form periodic dark lines on a substrate, wherein said periodic dark lines are capable of restrictedly positioning contacts on said substrate in a first direction; and
    exposing a trim mask to remove a portion of said periodic dark lines on said substrate, wherein said removed portion of said periodic dark lines are capable of unrestrictedly positioning contacts on said substrate in a second direction substantially perpendicular to said first direction, a location of said contacts being unrestricted to a grid pattern.

12. The method according to claim 11, wherein said contacts have a first size in the first direction and a second size in the second direction smaller than said first size.

13. The method according to claim 11, wherein said reusable template mask comprises a reusable chromeless alternating phase-shifting template mask with periodic 0 degree and 180 degree regions, said template mask being exposed to create periodic unexposed dark lines at the boundary of 0 degree and 180 degree regions, the period of the 0 degree and 180 degree regions on the chromeless alternating phase-shifting template mask being one transistor pitch so that the period of the dark lines is half of that and the exposure of the trim mask is adapted to remove unwanted parts of the periodic dark lines and small cuts of the dark lines left from the regularly-placed rectangular contacts.

14. The method according to claim 11, wherein a size and location of contacts in the first direction are determined by the exposure of the reusable template mask, and wherein a size and location of contacts in the second direction are determined by the exposure of the trim mask.

15. The method according to claim 11, wherein a grid pitch of said periodic dark lines comprises half of one transistor pitch in the first direction.

* * * * *